United States Patent
Yaung et al.

(10) Patent No.: US 6,897,504 B2
(45) Date of Patent: May 24, 2005

(54) SALICIDED MOS DEVICE AND ONE-SIDED SALICIDED MOS DEVICE, AND SIMULTANEOUS FABRICATION METHOD THEREOF

(75) Inventors: Dun-Nian Yaung, Taipei (TW); Sou-Kuo Wu, Hsinchu (TW); Ho-Ching Chen, Hsinchu (TW)

(73) Assignee: Taiwan Semiconductor Manufacturing, Hsin-Chu (TW)

( * ) Notice: Subject to any disclaimer, the term of this patent is extended or adjusted under 35 U.S.C. 154(b) by 0 days.

(21) Appl. No.: 10/403,474

(22) Filed: Mar. 31, 2003

(65) Prior Publication Data

US 2004/0188771 A1 Sep. 30, 2004

(51) Int. Cl.⁷ .............................. H01L 27/108
(52) U.S. Cl. ................. 257/296; 257/291; 257/292; 257/298; 257/300; 257/301
(58) Field of Search ................ 257/118, 229, 257/233, 234, 257, 258, 290, 291, 292, 461, 462, 296, 298, 300, 301, 338, 357

(56) References Cited

U.S. PATENT DOCUMENTS

| | | | |
|---|---|---|---|
| 6,040,593 A | * 3/2000 | Park ........................ 257/292 |
| 6,063,706 A | 5/2000 | Wu .......................... 438/682 |
| 6,194,258 B1 | * 2/2001 | Wuu ........................ 438/200 |
| 6,277,683 B1 | 8/2001 | Pradeep et al. ............ 438/200 |
| 6,337,240 B1 | * 1/2002 | Chu .......................... 438/241 |

* cited by examiner

Primary Examiner—Minhloan Tran
Assistant Examiner—Tan Tran
(74) Attorney, Agent, or Firm—Thomas, Kayden, Horstemeyer & Risley

(57) ABSTRACT

A method of fabricating a salicided MOS and a one-sided salicided MOS device on a semiconductor substrate. A conformal oxide layer and an organic layer are sequentially formed on first and second MOS devices and the substrate. The first MOS has a first gate structure, a first spacer and first and second doped regions. The second MOS has a second gate structure, a second spacer and third and fourth doped regions. Anisotropic etching is performed to remove part of the organic layer until the oxide layer on the first and the second gate structures is exposed, wherein a remaining organic layer is left above the substrate. The oxide layer on the first and the second gate structures is removed. The remaining organic layer is removed. The oxide layer on the first, second, and third doped regions is removed. Thus, a silicide layer cannot form on the fourth doped region.

17 Claims, 6 Drawing Sheets

US 6,897,504 B2

SALICIDED MOS DEVICE AND ONE-SIDED SALICIDED MOS DEVICE, AND SIMULTANEOUS FABRICATION METHOD THEREOF

BACKGROUND OF THE INVENTION

1. Field of the Invention

The present invention relates to a semiconductor fabrication. More particularly, the invention relates to a salicided MOS device and a one-sided salicided MOS device on a semiconductor substrate and a simultaneous fabrication method thereof.

2. Description of the Related Art

Complimentary metal oxide semiconductor, (CMOS), devices, for both logic and memory applications, fabricated on the same semiconductor chip, have been commonly used. For example, an embedded dynamic random access memory (DRAM) device includes a memory array and a logic circuit array formed together in a single integrated circuit (IC) chip. This embedded DRAM can thus access a large amount of data at much higher speeds. The embedded DRAM is thus widely used in logic circuitry, to process large amounts of data, such as in a graphic or an image microprocessor. An accomplished embedded DRAM typically includes a logic circuit, a transfer field effect transistor (transfer FET, MOSFET) array, and a capacitor coupled to the transfer FET, wherein the transfer FET serves as a electrode of the capacitor and a selective switch when the transfer FET is selected by a bit line. The voltage status of the capacitor can therefore be read or changed through the transfer FET. One transfer FET typically includes a gate structure and an interchangeable source/drain region on each side of the gate structure. The capacitor is coupled to the interchangeable source/drain region on one side of the gate structure, typically is the source region.

In order to obtain lower resistance and increase device speed, a method of performing a self-aligned silicide (salicide) process to form a salicided layer on all exposed silicon surfaces of the gate and source/drain region is proposed. However, the salicide process usually consumes junction depth, causing a shallow junction (also silicide junction), which may cause a charge leakage of the capacitor. For some leakage-concerned products, such as DRAM and CMOS image sensor, non-silicide junction is required for partial positions, for example, the position(s) of source/drain region of MOS connecting capacitor in DRAM and the position(s) of source/drain region of MOS connecting photodiode region in CMOS image sensor.

FIGS. 1–3 are sectional views of a portion of a semiconductor substrate, schematically illustrating a conventional fabrication process for forming an embedded DRAM. In FIG. 1, an isolation structure 110, such as STI (shallow trench isolation) or FOX (field oxide isolation), is formed in/on a semiconductor substrate 100 so as to create a DRAM active region 102 and a logic active region 104 on the substrate 100. An oxide layer (not shown) and a polysilicon layer (not shown) are sequentially formed on the substrate 100. Then, the oxide layer and the polysilicon layer are patterned to form a first gate structure 116 in the DRAM active region 102 and a second gate structure 118 in the logic active region 104. The gate structure 116 includes a gate 120a and a gate oxide layer 120b; and the gate structure 118 includes a gate 130a and a gate oxide layer 130b.

In FIG. 1, using the gate structures 116, 118 as a mask, lightly doped (LDD) regions 140 are respectively formed in the substrate 100 on each side of the gate structures 116, 118 by implantation. Then, a spacer 150 is formed on each sidewall of the first gate structure 116 and a spacer 155 is formed on each sidewall of the second gate structure 118. Then, interchangeable source/drain regions 160, 162, 164, 166 are respectively formed in the substrate 100 on each side of the gate structures 116, 118 by another implantation.

In FIG. 2, a photoresist layer 210 is formed on part of the substrate 100 to cover the interchangeable source/drain region 160 which will couple with a capacitor in subsequent process. Then, a self-aligned suicide (salicide) process is performed to form a silicide layer 220 on the gates 120a, 130a and the interchangeable source/drain regions 162, 164, 166.

In FIG. 3, the photoresist layer 210 is removed. Then, a capacitor 310 abutting the interchangeable source/drain region 160, such as a trench-type capacitor, is formed in the substrate 100. Number 320 denotes a dielectric film layer, conformal to an inner trench. Number 330 denotes an electrode coupled with the interchangeable source/drain region 160. The substrate 100 serves as another electrode of the capacitor 310.

According to the conventional method, however, since misalignment of the photoresist layer 210 easily occurs in submicron process, the DRAM cell performance cannot be precisely controlled. For example, when the misaligned photoresist layer 210' covers part of the gate 120a, the silicide layer 220 cannot thoroughly form on the gate 120a, as shown in FIG. 4A. This affects the conductivity of the gate 120a. In addition, when the misaligned photoresist layer 210" covers part of the interchangeable source/drain region 160, the silicide layer 220 partially forms on the interchangeable source/drain region 160, as shown in FIG. 4B. This may cause junction leakage (silicide junction), thereby decreasing device reliability.

U.S. Pat. No. 6,277,683 discloses a process for forming a salicided CMOS device and a non-salicided CMOS device on a semiconductor substrate. The method uses only one silicon nitride layer to provide a component for a composite spacer on the sides of the salicided CMOS device, and to provide a blocking shape for the non-salicided CMOS device during metal silicide formation. Nevertheless, this conventional method does not describe the process for forming a one-sided salicided CMOS device.

U.S. Pat. No. 6,063,706 discloses a process for forming a salicided device and an ESD protective device having no salicide on a semiconductor substrate. The method uses a pad silicon nitride to cover the ESD protective device, and then two-step salicide process is performed on the substrate to form a silicide layer on the surface of a functional region. Nevertheless, this conventional method does not describe the process for forming a one-sided salicided CMOS device.

U.S. Pat. No. 6,337,240 discloses a process for forming an embedded DRAM. The method implants ions onto a substrate with different dopant concentration to form different thickness gate oxide layers. An insulation layer serving as a mask is formed to cover the DRAM memory region. Then, a salicide process is performed to form a salicided layer on the surface of a logic region. Nevertheless, this conventional method does not describe the process for forming a one-sided salicided CMOS device.

SUMMARY OF THE INVENTION

The object of the present invention is to provide a salicided MOS device and a one-sided salicided MOS device on a semiconductor substrate and a simultaneous fabrication method thereof.

Another object of the present invention is to provide a method of fabricating an embedded DRAM so as to decrease the silicide junction in DRAM region.

Another object of the present invention is to provide a method of fabricating a CMOS image sensor so as to decrease the silicide junction at a source/drain region connecting a photodiode region.

In order to achieve these objects, the present invention provides a method of fabricating a salicided MOS device and a one-sided salicided MOS device on a semiconductor substrate. A semiconductor substrate having a first region and a second region is provided, wherein the first region of the substrate is used for the salicided MOS device, and the second region of the substrate is used for the one-sided salicided MOS device. A first MOS device is formed on the substrate in the first region and a second MOS device is formed on the substrate in the second region, wherein the first MOS device has a first gate structure on the substrate, first and second doped regions formed in the substrate and a first spacer formed on each sidewall of the first gate structure, and the second MOS device has a second gate structure on the substrate, third and fourth doped regions formed in the substrate and a second spacer formed on each sidewall of the second gate structure. A conformal oxide layer is formed on the first MOS device, the second MOS device and the substrate. An organic layer is formed on the oxide layer. Anisotropic etching is performed to remove part of the organic layer until the oxide layer on the first and the second gate structures is exposed, wherein a remaining organic layer is left above the substrate. The oxide layer on the first gate structure and the second gate structure is removed. The remaining organic layer is removed. The oxide layer on the first, second, and third doped regions is removed. A salicide procedure is performed to form a salicided layer on the first gate structure, the first doped region, the second doped region, the second gate structure and the third doped region.

According to the present method, the present invention also provides a structure of a salicided MOS device and a one-sided salicided MOS device. A semiconductor substrate having a first region and a second region is provided, wherein the first region of the substrate is used for the salicided MOS device, and the second region of the substrate is used for the one-sided salicided MOS device. A first MOS device is formed on the substrate in the first region and a second MOS device formed on the substrate in the second region, wherein the first MOS device has a first gate structure on the substrate, first and second doped regions formed in the substrate and a first spacer formed on each sidewall of the first gate structure, and the second MOS device has a second gate structure on the substrate, third and fourth doped regions formed in the substrate and a second spacer formed on each sidewall of the second gate structure. A conformal oxide layer is formed on the fourth doped region. A salicided layer is formed on the first gate structure, the first doped region, the second doped region, the second gate structure and the third doped region.

The present invention improves on the prior art in its use of conformal oxide layer and an organic layer sequentially formed on first and second MOS devices and the substrate. Then, anisotropic etching is performed to remove part of the organic layer until the oxide layer on the first and the second gate structures is exposed, wherein a remaining organic layer is left above the substrate. Then, the oxide layer on the first and the second gate structures is removed. Then, the remaining organic layer is removed. Then, the oxide layer on the first, second, and third doped regions is removed. Thus, silicide layer cannot form on the fourth doped region, thereby obtaining a salicided MOS device and a one-sided salicided MOS device on the same substrate. The present invention can apply to an embedded DRAM process and a CMOS image sensor process, thereby improving device reliability and ameliorating the other disadvantages of the prior art.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The method of fabricating a salicided MOS device and a one-sided salicided MOS device is herein described in detail. The present method is suitable for application to an embedded DRAM process and a CMOS image sensor process. FIGS. 5~10 illustrate a fabrication process for forming an embedded DRAM, according to a first embodiment of the present invention. FIGS. 11~16 illustrate a fabrication process for forming a CMOS image sensor, according to a second embodiment of the present invention.

The First Embodiment

An embedded DRAM includes a DRAM region (or memory region) and a peripheral region (or logic region). In the invention, one MOS device represents a DRAM FET in the DRAM region and another MOS device represents a logic FET in the peripheral region.

Figure 1:
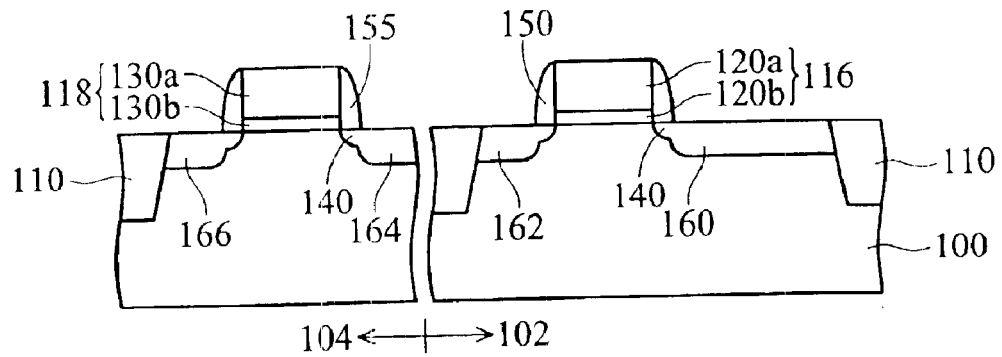
FIGS. 1~3 are sectional views of a portion of a semiconductor substrate, schematically illustrating a conventional fabrication process for forming an embedded DRAM.
Figure 2:
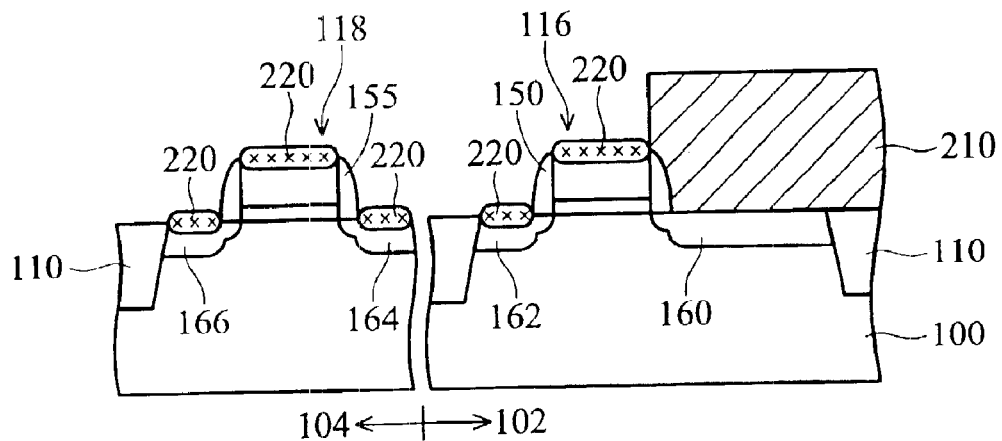
Figure 3:
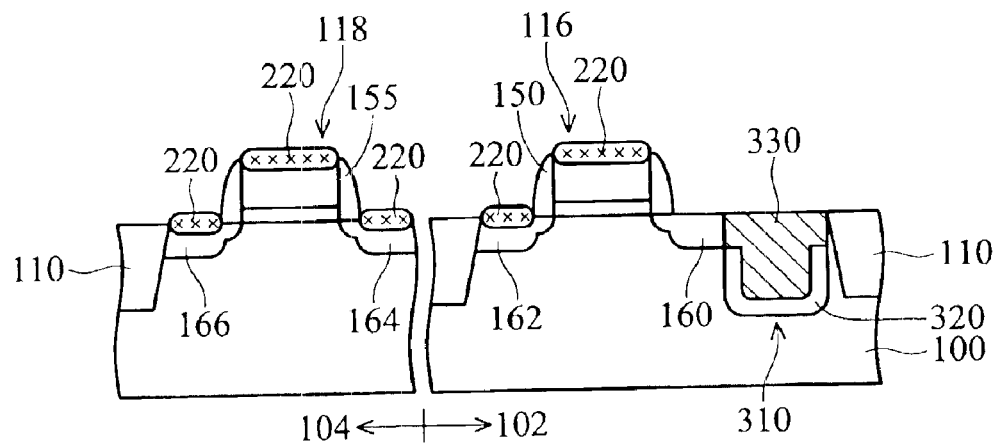
Figure 4A:
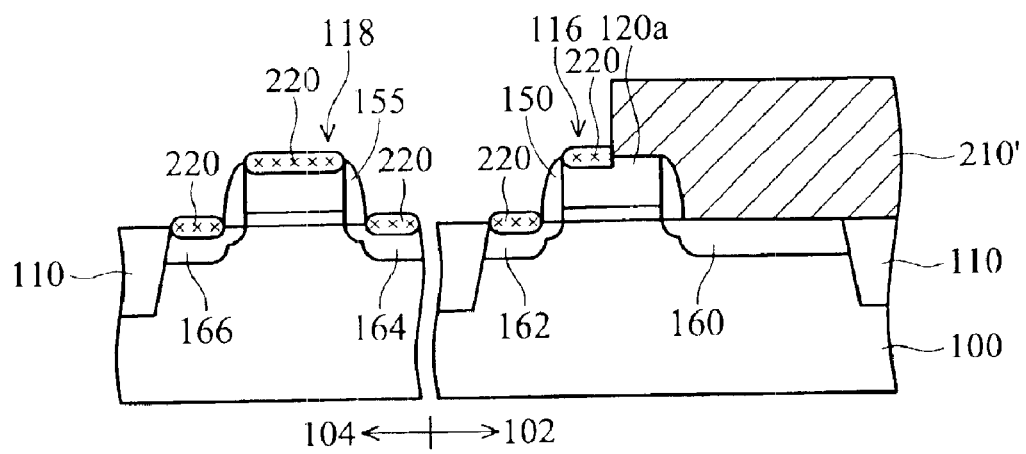
FIGS. 4A and 4B are schematic views of the conventional fabrication process, that show drawbacks when misalignment occurs.
Figure 4B:
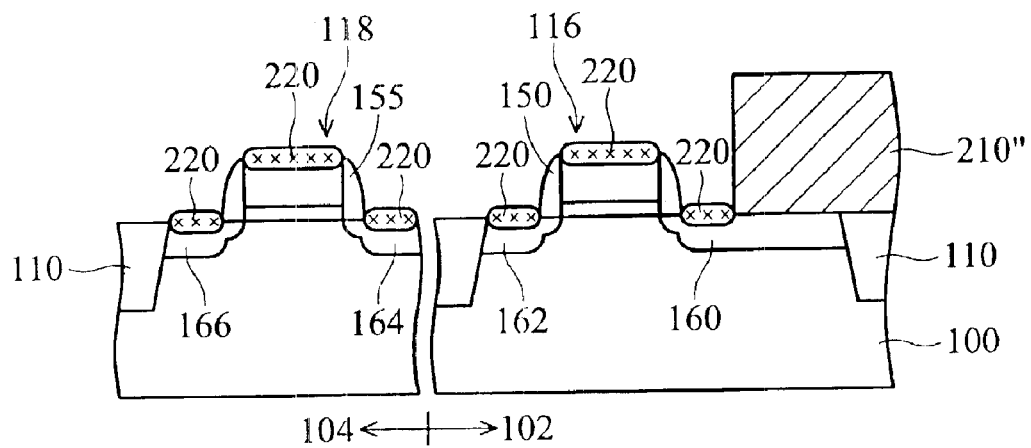
Figure 5:
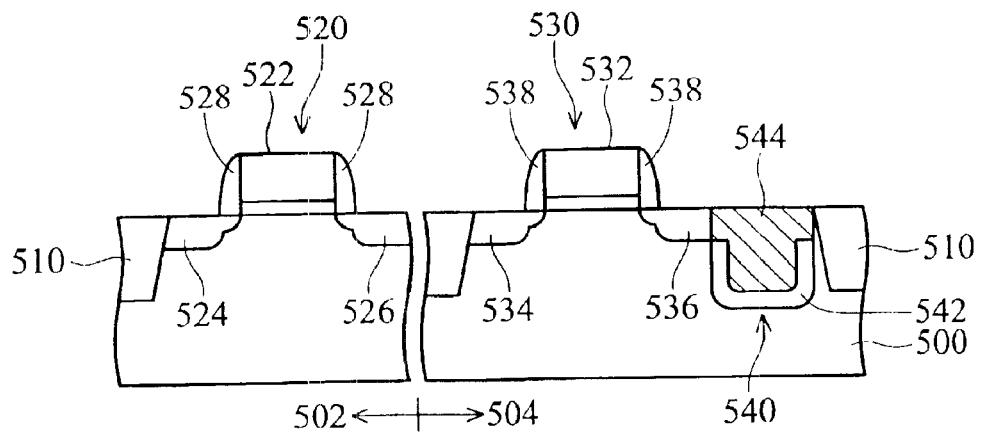
FIGS. 5~10 are sectional views of a portion of a semiconductor substrate, schematically illustrating a fabrication process for forming an embedded DRAM, according to a first embodiment of the present invention.

In FIG. 5, a semiconductor substrate 500, such as a P-type substrate, having a logic region 502 (or a peripheral region) and a DRAM region 504 (or memory region) is provided. The logic region 502 of the substrate 500 is used for the salicided MOS device, and the DRAM region 504 of the substrate 500 is used for the one-sided salicided MOS device. An isolation structure 510, such as a field oxide layer formed by local oxidation (LOCOS) process or a shallow trench isolation (STI) structure, is formed on/in the substrate 500 to define several active areas, enclosed by the isolation structure 510. It should be noted that this embodiment will be described for NMOS devices, however, if desired this embodiment can also be applied to PMOS devices.

In FIG. 5, a first MOS device 520 is formed on the substrate 500 in the logic region 502 and a second MOS device 530 is formed on the substrate 500 in the DRAM region 504. The first MOS device 520 has a first gate structure 522 formed on the substrate 500, first and second doped regions 524, 526 formed in the substrate 500 and a first spacer 528 formed on each sidewall of the first gate structure 522. The second MOS device 530 has a second gate structure 532 formed on the substrate 500, third and fourth doped regions 534, 536 formed in the substrate 500 and a second spacer 538 formed on each sidewall of the second gate structure 530. In this embodiment, the second and third doped regions 526, 534 locate between the first doped region 524 and the fourth doped region 536.

A demonstrative method for forming the first MOS device 520 and the second MOS device 530 follows. For example, a gate insulation layer, such as $SiO_2$, is formed on the substrate 500. A polysilicon layer is formed on the gate insulation layer. The polysilicon layer and the gate insulation layer are patterned to expose part of the substrate 500, thus forming the first gate structure 522 and the second gate structure 532, each gate structure 522/532 including a gate and a gate oxide layer. Using the first gate structure 522 and the second gate structure 532 as a mask, and $n^-$-type ions are implanted onto the substrate 500 to form lightly doped regions (LDD) in the substrate 500 in the logic region 502 and the DRAM region 504. A conformal dielectric layer is formed on the substrate 500, and the conformal dielectric layer is etched back by dry etching. Thus, the first spacer 528 is formed on each sidewall of the first gate structure 522, and simultaneously, the second spacer 538 is formed on each sidewall of the second gate structure 532. The spacers 528, 538 can be SiN, SiON, NO (silicon nitride/silicon oxide) or ONO (silicon oxide/silicon nitride/silicon oxide). Using the first gate structure 522, the first spacer 528, the second gate structure 532 and the second spacer 538 as a mask, $n^+$-type ions are implanted onto the substrate 500 to form heavily doped regions in the substrate 500 in the logic region 502 and the DRAM region 504. In this embodiment, the lightly doped regions and the heavily doped regions in the logic region 502 serve as the first doped region 524 and the second doped region 526, and the lightly doped regions and the heavily doped regions in the DRAM region 504 serve as the third doped region 534 and the fourth doped region 536. The first and the second doped regions 524, 526 are interchangeable source/drain of the first MOS device 520. The third and the fourth doped regions 534, 536 are interchangeable source/drain of the second MOS device 530.

In FIG. 5, a trench-type capacitor 540 (also storage node) electrically coupled to the fourth doped region 536 is formed in the DRAM region 504. The trench capacitor 540 includes a trench formed in the substrate 500. A dielectric film layer 542, conformal to an inner trench surface, is formed. An electrode 544 of the trench capacitor 540 is formed to couple with the fourth doped region 536. The substrate 500 serves as another electrode of the trench capacitor 540. The formation of the trench capacitor 540 uses a convention process. In order to avoid obscuring aspects of the present invention, the details of the trench capacitor process are not further described.

Figure 6:
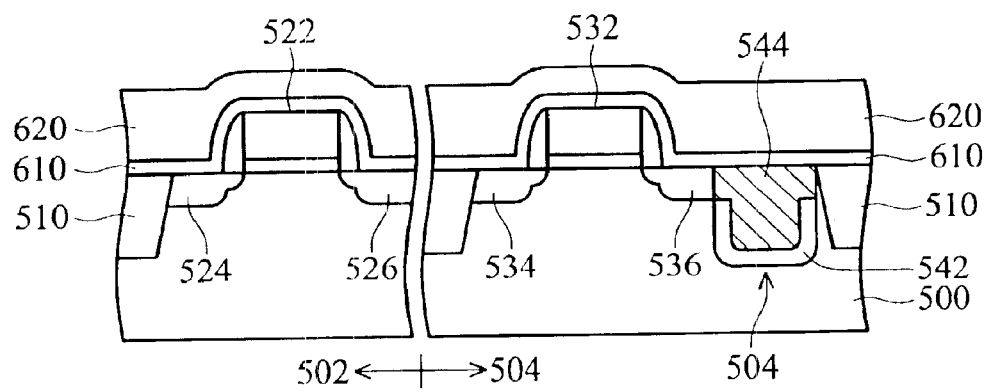

In FIG. 6, a conformal insulation layer 610, such as $SiO_2$, is formed on the first MOS device 520, the second MOS device 530 and the substrate 500 by, for example, CVD (chemical vapor deposition). Then, an organic layer 620, serving as a sacrificial layer, is formed on the insulation layer 610 by spin coating. The organic layer 620 includes a material such as propylene glycol monomethyl ether, sometimes used as a bottom antireflective coating (BARC) layer.

Figure 7:
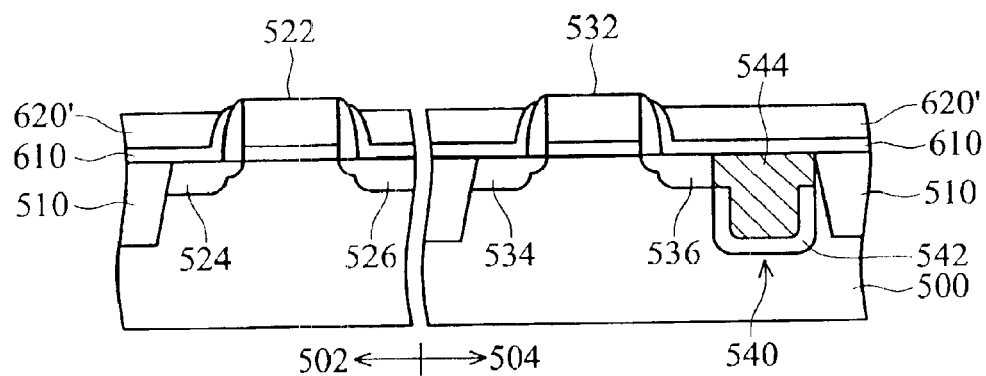

In FIG. 7, anisotropic etching, using $CF_4/HBr/O_2$ or $Cl_2/O_2$ as an etchant, is used to remove part of the organic layer 620 until the insulation layer 610 located on the first and the second gate structures 522, 532 is exposed, wherein a remaining organic layer 620' is left above the substrate 500. That is, this anisotropic etching procedure etches the organic layer 620, selectively stopping at the apparently underlying insulation layer 610, and creating remaining organic layer 620 above the doped regions of all MOS devices. Then, the apparent insulation layer 610 located on the first gate structure 522 and the second gate structure 532 is removed by anisotropic etching, as shown in FIG. 7.

Figure 8:
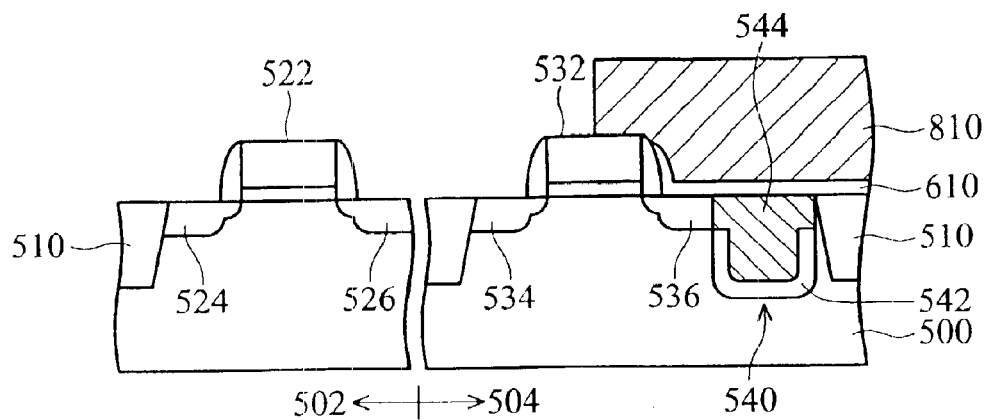

In FIG. 8, the remaining organic layer 620' is removed by isotropic etching, such as wet etching. Then, the insulation layer 610 located on the first doped region 524, the second doped region 526 and the third doped region 534 are removed.

A method for removing the insulation layer 610 located on the first doped region 524, the second doped region 526 and the third doped region 534, referring to FIG. 8, follows. An energy sensitive layer 810, such as photoresist (used as an example for the subsequent description), is formed to cover the insulation layer 610 on the fourth doped region 536. It is important to note that one end of the photoresist layer 810 can extend to the second gate structure 532, thereby increasing process margin and ameliorating the misalignment in the prior art. Then, the insulation layer 610 located on the first doped region 524, the second doped region 526 and the third doped region 534 is removed by isotropic etching, such as wet etching.

Next, the photoresist layer 810 is removed after wet or plasma stripping.

Figure 9:
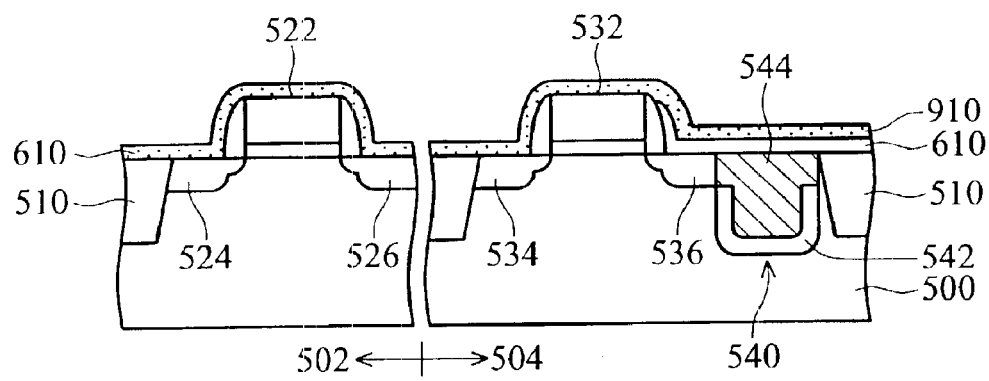

Selective formation of metal silicide, or salicide formation, on exposed silicon or polysilicon surfaces, in logic region 502 and DRAM region 504, is next performed. In FIG. 9, a metal layer 910, including a metallic material such as titanium, tungsten, molybdenum, tantalum or cobalt, is formed over the substrate 500. The metal layer 910 is formed by, for example, direct-current (DC) sputtering deposition process, and has a thickness of about 200~1000 angstroms. An anneal procedure, using rapid thermal annealing (RTA) or conventional furnace annealing, is then performed to trigger a silicide reaction between silicon and the metallic material included in the metal layer 910, in which silicon exists in the exposed surfaces of the first gate structure 522, the first doped region 524, the second doped region 526, the second gate structure 532 and the third doped region 534. The RTA process conditions can be controlled at a temperature of about 600~800° C. for about 30~60 seconds.

Figure 10:
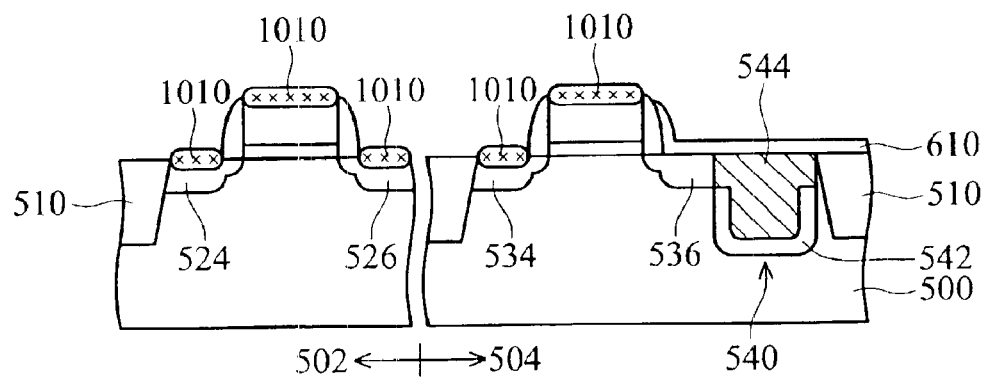

After silicide reaction, referring to FIG. 10, a silicide layer 1010, such as tungsten silicide, titanium silicide, molybdenum silicide, tantalum silicide or cobalt silicide, is formed on the first gate structure 522, the first doped region 524, the second doped region 526, the second gate structure 532 and the third doped region 534. Since the silicide layer 1010 is formed with self-aligning properties, the silicide layer 1010, is usually referred to as a self-aligned silicide (salicided) layer 1010. Next, a portion of the metal layer 910 of FIG. 9, unreacted with silicon, is removed by, for example, $H_2SO_4$—$H_2O_2$—HCl—$NH_4OH$ solution. Thus, the salicided layer 1010 remains, and the spacers 528 and 538 are exposed. Since the fourth doped region 536 and the trench capacitor 540 are covered by the insulation layer 610, no silicide reaction occurs thereon. In addition, another anneal procedure can be performed to further reduce the resistance of the salicided layer 1010.

The method of the invention simultaneously forming a salicided MOS device 1020 in the logic region 502 and a one-sided salicided MOS device 1030 in the DRAM region 504, is thus suitable for fabricating the embedded DRAM. In order to avoid obscuring aspects of the present invention, the remaining processes to accomplish an embedded device including a formation of, for example, multilevel interconnects is not described here.

The present invention improves on the prior art in its reduction of the gate resistance and one doped region (534) resistance of the DRAM MOS FET, and simultaneously increases the operating speed of the logic MOS FET. Also, the invention can avoid silicide junction at the other doped region (536) of the DRAM MOSFET coupled with a capacitor (540), thereby reducing charge leakage. Moreover, the present method has a larger process margin, thereby improving manufacturing yield and ameliorating the other disadvantages of the prior art.

The Second Embodiment

Figure 11:
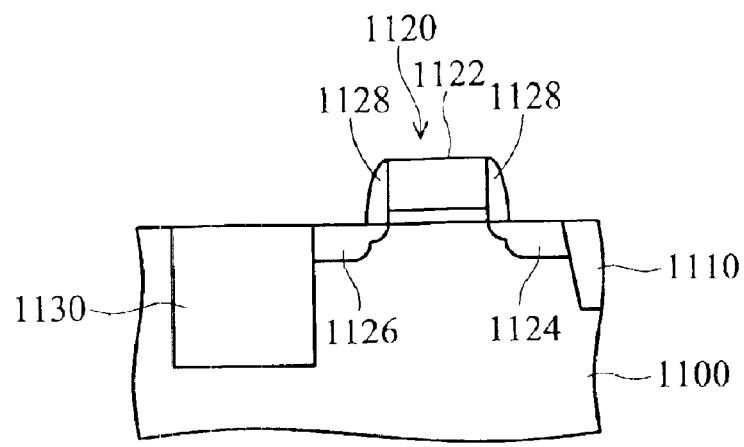
FIGS. 11~16 are sectional views of a portion of a semiconductor substrate, schematically illustrating a fabrication process for forming a CMOS image sensor, according to a second embodiment of the present invention.

In FIG. 11, a semiconductor substrate 1100, such as a P-type substrate or a P-well, is provided. An isolation structure 1110, such as a field oxide layer formed by local oxidation (LOCOS) process or a shallow trench isolation (STI) structure, is formed on the substrate 1100 to define several active areas, enclosed by the isolation structure 1110.

In FIG. 11, a NMOS device 1120 is formed on part of the substrate 1100. The NMOS device 1120 has a gate structure 1122 formed on the substrate 1100, first and second doped regions 1124, 1126 formed in the substrate 1100 and a spacer 1128 formed on each sidewall of the gate structure 1122.

A demonstrative method for forming the NMOS device 1120 follows. For example, a gate insulation layer, such as $SiO_2$, is formed on the substrate 1100. A polysilicon layer is formed on the gate insulation layer. The polysilicon layer and the gate insulation layer are patterned to expose part of the substrate 1100, thus forming the gate structure 1122 including a gate and a gate oxide layer. Using the gate structure 1122 as a mask, and $n^-$-type ions are implanted onto the substrate 1100 to form lightly doped regions (LDD) in the substrate 1100. A conformal dielectric layer is formed on the substrate 1100, and is then etched back by dry etching. Thus, the spacer 1128 is formed on each sidewall of the first gate structure 1122. The spacer 1128 can be SiN, SiON, NO (silicon nitride/silicon oxide) or ONO (silicon oxide/silicon nitride/silicon oxide). Using the gate structure 1122 and the spacer 1128 as a mask, $n^+$-type ions are implanted on to the substrate 1100 to form heavily doped regions therein. In this embodiment, the lightly doped regions and the heavily doped regions serve as the first doped region 1124 and the second doped region 1126. The first doped region 1124 and the second doped region 1126 are interchangeable source/drain of the MOS device 1120.

In FIG. 11, a deeper implant is then performed to complete the n-type region of the photodiode, 1130, continuous with the second doped region 1126.

Figure 12:
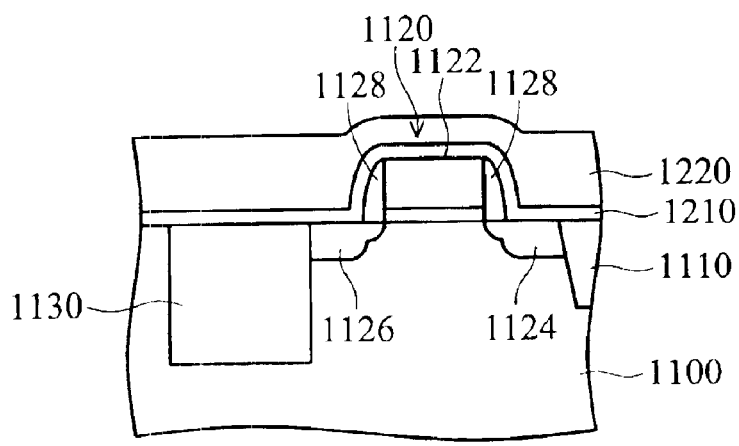

In FIG. 12, a conformal insulation layer 1210, such as $SiO_2$, is formed on the NMOS device 1120 by, for example, CVD. Then, an organic layer 1220, serving as a sacrificial layer, is formed on the insulation layer 1210 by spin coating. The organic layer 1220 includes a material such as propylene glycol monomethyl ether, sometimes used as a bottom antireflective coating (BARC) layer.

Figure 13:
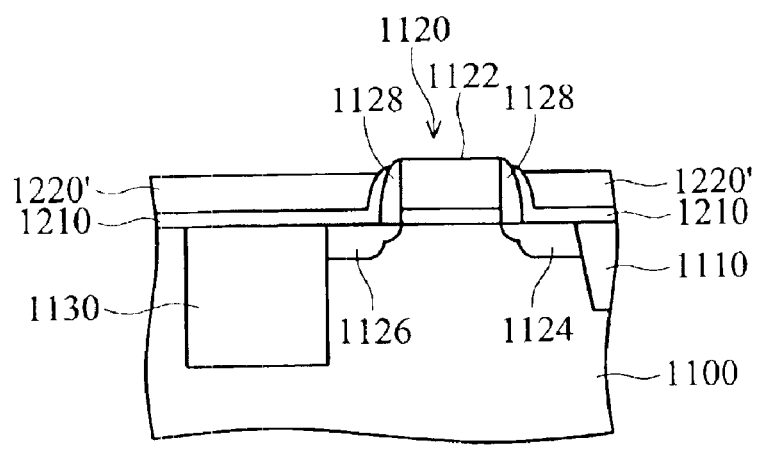

In FIG. 13, anisotropic etching, using $CF_4/HBr/O_2$ or $Cl_2/O_2$ as an etchant, is used to remove part of the organic layer 1220 until the insulation layer 1210 located on the gate structures 1122 is exposed, wherein a remaining organic layer 1220' is left above the substrate 1100. That is, this anisotropic etching procedure etches the organic layer 1220, selectively stopping at the apparently underlying insulation layer 1210, and creating remaining organic layer 1220 above the doped regions of all NMOS devices. Then, the apparent insulation layer 1210 located on the gate structure 1122 is removed by anisotropic etching, as shown in FIG. 13.

Figure 14:
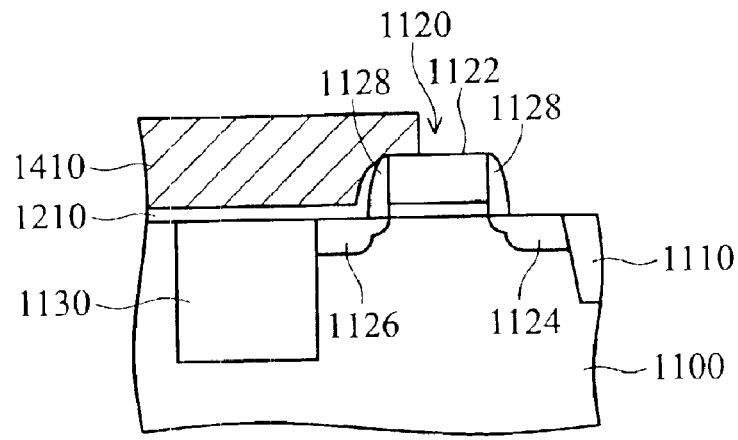

In FIG. 14, the remaining organic layer 1220' is removed by isotropic etching, such as wet etching. Then, the insulation layer 1210 located on the first doped region 1124 is removed.

A method for removing the insulation layer 1210 located on the first doped region 1124, referring to FIG. 14, follows. An energy sensitive layer 1410, such as photoresist (used as an example for the subsequent description), is formed to cover the insulation layer 1210 on the second doped region 1126. It is important to note that one end of the photoresist layer 1410 can extend to the gate structure 1122, thereby increasing process margin and ameliorating the misalignment in the prior art. Then, the insulation layer 1210 located on the first doped region 1124 is removed by isotropic etching, such as wet etching.

Next, the photoresist layer 1410 is removed after wet or plasma stripping.

Figure 15:
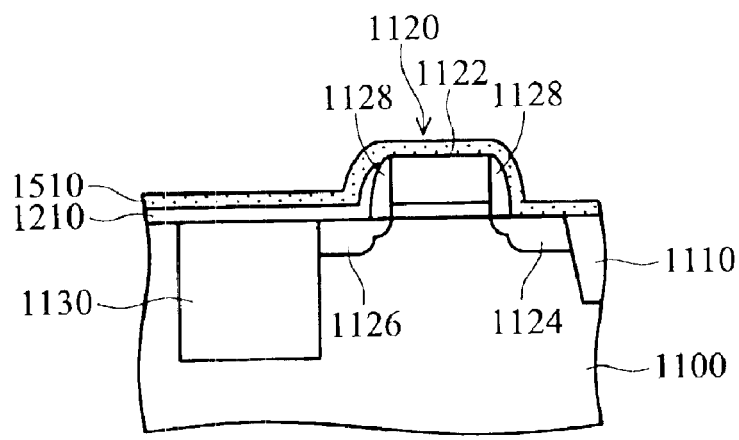

Selective formation of metal silicide, or salicide formation, on exposed silicon or polysilicon surfaces, is next performed. In FIG. 15, a metal layer 1510 including a metallic material, such as titanium, tungsten, molybdenum, tantalum or cobalt, is formed over the substrate 1100. The metal layer 1510 is formed by, for example, direct-current (DC) sputtering deposition process, and has a thickness of about 200~1000 angstroms. An anneal procedure, using rapid thermal annealing (RTA) or conventional furnace annealing, is then performed to trigger a silicide reaction between silicon and the metallic material included in the metal layer 1510, in which silicon exists in the exposed surfaces of the gate structure 1122 and the first doped region 1124. The RTA process conditions can be controlled at a temperature of about 600~800° C. for about 30~60 seconds.

Figure 16:
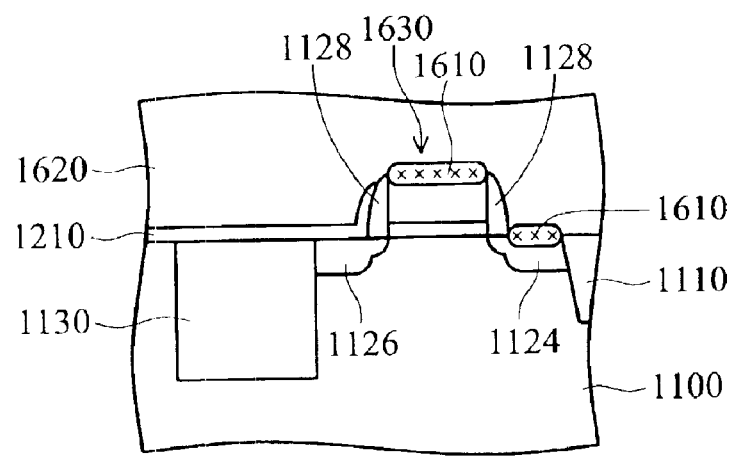

After silicide reaction, referring to FIG. 16, a silicide layer 1610, such as tungsten silicide, titanium silicide, molybdenum silicide, tantalum silicide or cobalt silicide, is formed on the gate structure 1122 and the first doped region 1124. Since the silicide layer 1610 is formed with self-aligning properties, the silicide layer 1610 is usually referred to as a self-aligned silicide (salicided) layer 610. Next, a portion of the metal layer 1510 of FIG. 15 unreacted with silicon is removed by, for example, $H_2SO_4$—$H_2O_2$—HCl—$NH_4OH$ solution. Thus, the salicided layer 1610 remains, and the spacer 1128 is exposed. Since the second doped region 1126 and the photodiode region 1130 are covered by the insulation layer 1210, no silicide reaction occurs thereon. In addition, another anneal procedure can be performed to further reduce the resistance of the salicided layer 1610. Next, a transparent insulation layer 1620, such as BPTEOS, is deposited to passivate the described structure.

Thus, the method of the invention forms a one-sided salicided MOS device 1630, suitable for fabricating the CMOS image sensor.

The present invention improves on the prior art in its reduction of the gate resistance and one doped region (1124) resistance of the MOS device. Also, the invention can avoid silicide junction occurring at the other doped region (1126) of the MOS device coupled with a photodiode (1130), thereby reducing current leakage. Moreover, the present method has a larger process margin, thereby improving manufacturing yield and ameliorating the other disadvantages of the prior art.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation to encompass all such modifications and similar arrangements.

What is claimed is:

1. A structure of a salicided MOS device and a one-sided salicided MOS device, comprising:
   a semiconductor substrate;
   a first MOS device and a second MOS device formed on the substrate, wherein the first MOS device comprises a first gate structure formed on the substrate, first and second doped regions formed in the substrate, and the second MOS device comprises a second gate structure formed on the substrate, and third and fourth doped regions formed in the substrate;
   a spacer formed on a sidewall of the second gate structure, wherein the spacer is located on part of the fourth doped region;
   a conformal insulation layer formed over the fourth doped region and a side of the second gate structure near the fourth doped region, wherein part of the conformal insulation layer overlies the spacer;
   a salicided layer formed on the first gate structure, the first doped region, the second doped region, the second gate structure and the third doped region but not the fourth doped region; and
   a capacitor electrically coupled to the fourth doped region, wherein part of the conformal insulation layer overlies the capacitor.

2. The structure according to claim 1, wherein the conformal insulation layer is manufactured by the steps of:
   forming a conformal previous insulation layer on the first MOS device, the second MOS device and the substrate;
   forming a sacrificial layer on the previous insulation layer;
   etching back the sacrificial layer until the previous insulation layer on top surfaces of the first and the second gate structures is exposed, wherein a remaining sacrificial layer is left above the substrate;
   removing the previous insulation layer on the top surfaces of the first and second gate structures;
   removing the remaining sacrificial layer; and
   removing the previous insulation layer on the first, second, and third doped regions.

3. The structure according to claim 2, wherein the sacrificial layer is an organic layer.

4. The structure according to claim 1, further comprising a first spacer formed on a first sidewall of the first gate structure, a second spacer formed on a second sidewall of the first gate structure and a third spacer formed on a third sidewall of the second gate structure, wherein the first spacer is located on part of the first doped region, the second spacer is located on part of the second doped region and the third spacer is located on part of the third doped region.

5. The structure according to claim 1, wherein a double insulator comprising the spacer and part of the conformal insulation layer is disposed on the sidewall of the second gate structure.

6. A structure of a one-sided salicided MOS device, suitable for a CMOS image sensor, the CMOS image sensor comprising:
   a semiconductor substrate;
   a MOS device formed on the substrate, wherein the MOS device has a gate structure on the substrate, first and second doped regions formed in the substrate, a first spacer formed on a first sidewall of the gate structure and a second spacer formed on a second sidewall of the gate structure, wherein the first spacer is located on part of the first doped region and the second spacer is located on part of the second doped region;
   a photodiode region formed in the substrate, wherein the photodiode region electrically couples to the second doped region;
   a conformal insulation layer formed on the second doped region, the second spacer and the photodiode region; and
   a salicided layer formed on the gate structure and the first doped region but not the second doped region and the photodiode region, wherein the conformal insulation layer is lower than a top surface of the salicided layer on the gate structure;
   wherein a double insulator, comprising the second spacer and part of the conformal insulation layer, is disposed on the second sidewall of the gate structure, and a single insulator, comprising the first spacer, is disposed on the first sidewall of the gate structure.

7. The structure according to claim 6, wherein the conformal insulation layer is manufactured by the steps of:
   forming a conformal previous insulation layer on the MOS device, the photodiode region and the substrate;
   forming an organic layer on the previous insulation layer;
   performing anisotropic etching to remove part of the organic layer until the previous insulation layer on the top surface of the gate structure is exposed, wherein a remaining organic layer is left above the substrate;
   removing the previous insulation layer on the top surface of the gate structure;
   removing the remaining organic layer; and
   removing the previous insulation layer on the first doped region.

8. The structure according to claim 7, wherein the conformal previous insulation layer is a $SiO_2$ layer.

9. The structure according to claim 7, wherein the organic layer comprises propylene glycol monomethyl ether.

10. The structure according to claim 6, wherein part of the conformal insulation layer directly overlies a top surface of the photodiode region.

11. The structure according to claim 6, wherein the first and second spacers comprise SiN or SiON.

12. The structure according to claim 6, wherein the conformal insulation layer is a $SiO_2$ layer.

13. The structure according to claim 6, wherein the salicided layer is a tungsten suicide, titanium silicide, molybdenum silicide, tantalum suicide or cobalt silicide layer.

14. A structure of a salicided MOS device and a one-sided salicided MOS device, comprising:
   a semiconductor substrate;
   a first MOS device and a second MOS device formed on the substrate, wherein the first MOS device comprises a first gate structure formed on the substrate, first and second doped regions formed in the substrate, and the second MOS device comprises a second gate structure formed on the substrate, and third and fourth doped regions formed in the substrate;
   a conformal insulation layer formed over the fourth doped region and a side of the second gate structure near the fourth doped region;
   a salicided layer formed on the first gate structure, the first doped region, the second doped region, the second gate structure and the third doped region but not the fourth doped region, wherein the conformal insulation layer is lower than a top surface of salicided layer on the second gate structure; and a capacitor electrically coupled to the fourth doped region, wherein part of the conformal insulation layer overlies the capacitor.

15. The structure according to claim 14, wherein the conformal insulation layer is manufactured by the steps of:

forming a conformal previous insulation layer on the first MOS device, the second MOS device and the substrate;

forming a sacrificial layer on the previous insulation layer;

etching back the sacrificial layer until the previous insulation layer on top surfaces of the first and the second gate structures is exposed, wherein a remaining sacrificial layer is left above the substrate;

removing the previous insulation layer on the top surfaces of the first and second gate structures;

removing the remaining sacrificial layer; and removing the previous insulation layer on the first, second, and third doped regions.

16. The structure according to claim 14, further comprising a first spacer formed on a first sidewall of the first gate structure, a second spacer formed on a second sidewall of the first gate structure, a third spacer formed on a third sidewall of the second gate structure and a fourth spacer formed on a fourth sidewall of the second gate structure, wherein the first spacer is located on part of the first doped region, the second spacer is located on part of the second doped region, the third spacer is located on part of the third doped region and the fourth spacer is located on part of the fourth doped region, wherein part of the conformal insulation layer overlies the fourth spacer.

17. The structure according to claim 16, wherein a double insulator comprising the fourth spacer and part of the conformal insulation layer is disposed on the fourth sidewall of the second gate structure.

* * * * *